(12) United States Patent
Saklang et al.

(10) Patent No.: US 12,469,773 B2
(45) Date of Patent: Nov. 11, 2025

(54) SEMICONDUCTOR DEVICE WITH ATTACHED BATTERY AND METHOD THEREFOR

(71) Applicant: NXP USA, INC., Austin, TX (US)

(72) Inventors: Chayathorn Saklang, Bangplee (TH); Namrata Kanth, Mesa, AZ (US); Stephen Ryan Hooper, Queen Creek, AZ (US); Scott M. Hayes, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 476 days.

(21) Appl. No.: 18/059,465

(22) Filed: Nov. 29, 2022

(65) Prior Publication Data

US 2024/0178111 A1    May 30, 2024

(51) Int. Cl.
*H01L 23/495* (2006.01)
*H01L 21/48* (2006.01)
*H01L 21/56* (2006.01)
*H01L 23/31* (2006.01)

(52) U.S. Cl.
CPC .... *H01L 23/49593* (2013.01); *H01L 21/4825* (2013.01); *H01L 21/4842* (2013.01); *H01L 21/565* (2013.01); *H01L 23/3107* (2013.01); *H01L 23/49503* (2013.01); *H01L 23/4952* (2013.01); *H01L 23/49555* (2013.01)

(58) Field of Classification Search
CPC ....... H01L 21/4821–4842; H01L 21/563–566; H01L 23/28–3192; H01L 23/495–49596; H01L 23/58; H01L 23/49593
See application file for complete search history.

(56) References Cited

U.S. PATENT DOCUMENTS

| | | | |
|---|---|---|---|
| 4,998,888 A | 3/1991 | Link et al. | |
| 5,055,704 A | 10/1991 | Link et al. | |
| 5,124,782 A * | 6/1992 | Hundt | H01L 23/49593 361/728 |
| 5,289,034 A * | 2/1994 | Hundt | H01L 23/49593 257/691 |

(Continued)

FOREIGN PATENT DOCUMENTS

EP    0503805 A1    9/1992

OTHER PUBLICATIONS

U.S. Appl. No. 17/660,650, filed Apr. 26, 2022, entitled "Semiconductor Device With Embedded Battery and Method Therefor".

*Primary Examiner* — Andres Munoz

(57) ABSTRACT

A method of manufacturing a semiconductor device with an attached battery is provided. The method includes affixing a semiconductor die to a die pad region of a first battery lead of a leadframe. The first battery lead of the leadframe is separated from a second battery lead of the leadframe. An encapsulant encapsulates the semiconductor die and portions of the first and second battery leads of the leadframe. The battery is affixed to an exposed portion of the first battery lead of the leadframe such that a first terminal of the battery is conductively connected to the first battery lead. An exposed portion of the second battery lead of the leadframe is bent to overlap a top surface portion of the battery such that a second terminal of the battery conductively connected to the second battery lead.

14 Claims, 11 Drawing Sheets

(56) References Cited

U.S. PATENT DOCUMENTS

| | | | | |
|---|---|---|---|---|
| 5,403,782 | A | * | 4/1995 | Dixon ............... H01L 23/49593 29/827 |
| 5,498,903 | A | | 3/1996 | Dixon et al. |
| 6,109,530 | A | | 8/2000 | Larson et al. |
| 6,208,114 | B1 | | 3/2001 | Jones et al. |
| 2002/0004163 | A1 | * | 1/2002 | Matsuura .......... H01M 10/4257 429/96 |
| 2005/0129989 | A1 | * | 6/2005 | Edwards ................ H01L 23/58 429/176 |
| 2007/0210441 | A1 | | 9/2007 | Corisis et al. |
| 2011/0292632 | A1 | * | 12/2011 | Wen .................. H01L 23/49575 257/773 |
| 2013/0001756 | A1 | * | 1/2013 | Chen ................ H01L 23/49811 257/666 |

* cited by examiner

SEMICONDUCTOR DEVICE WITH ATTACHED BATTERY AND METHOD THEREFOR

BACKGROUND

Field

This disclosure relates generally to semiconductor devices, and more specifically, to semiconductor devices with an attached battery and method of forming the same.

Related Art

Semiconductor devices are often found in a large spectrum of electronic products—from sewing machines to washing machines, from automobiles to cellular telephones, and so on. Many of these semiconductor devices may include sensitive systems and may be produced in high volumes to drive costs down. However, some factors such as manufacturing processes may be optimized for product costs but could adversely affect or constrain applications using these semiconductor devices. It is therefore desirable, as technology progresses, to accommodate flexible and less constrained applications of these semiconductor devices while keeping product costs in focus.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, a semiconductor device having an attached battery. The semiconductor device includes a package leadframe configured to form an integrated battery holder. The leadframe includes a first section and a second section. The first section is configured as a first battery lead and the second section is configured as a second battery lead of the leadframe. An encapsulant encapsulates portions of the first and second battery leads. An exposed portion first battery lead is formed a base portion of the battery holder and an exposed portion of the second battery lead is formed as clasp or securing portion of the battery holder. A battery is affixed to the base portion of the battery holder and the clasp or securing portion holds and secures the battery in place. The battery leads are connected to the respective terminals of the battery by way of the battery holder allowing for the semiconductor device to accommodate various battery sizes, shapes, and configurations. The battery is configured to supply an operating voltage and current to the semiconductor device sufficient to operate in a self-sustained manner.

Figure 1:
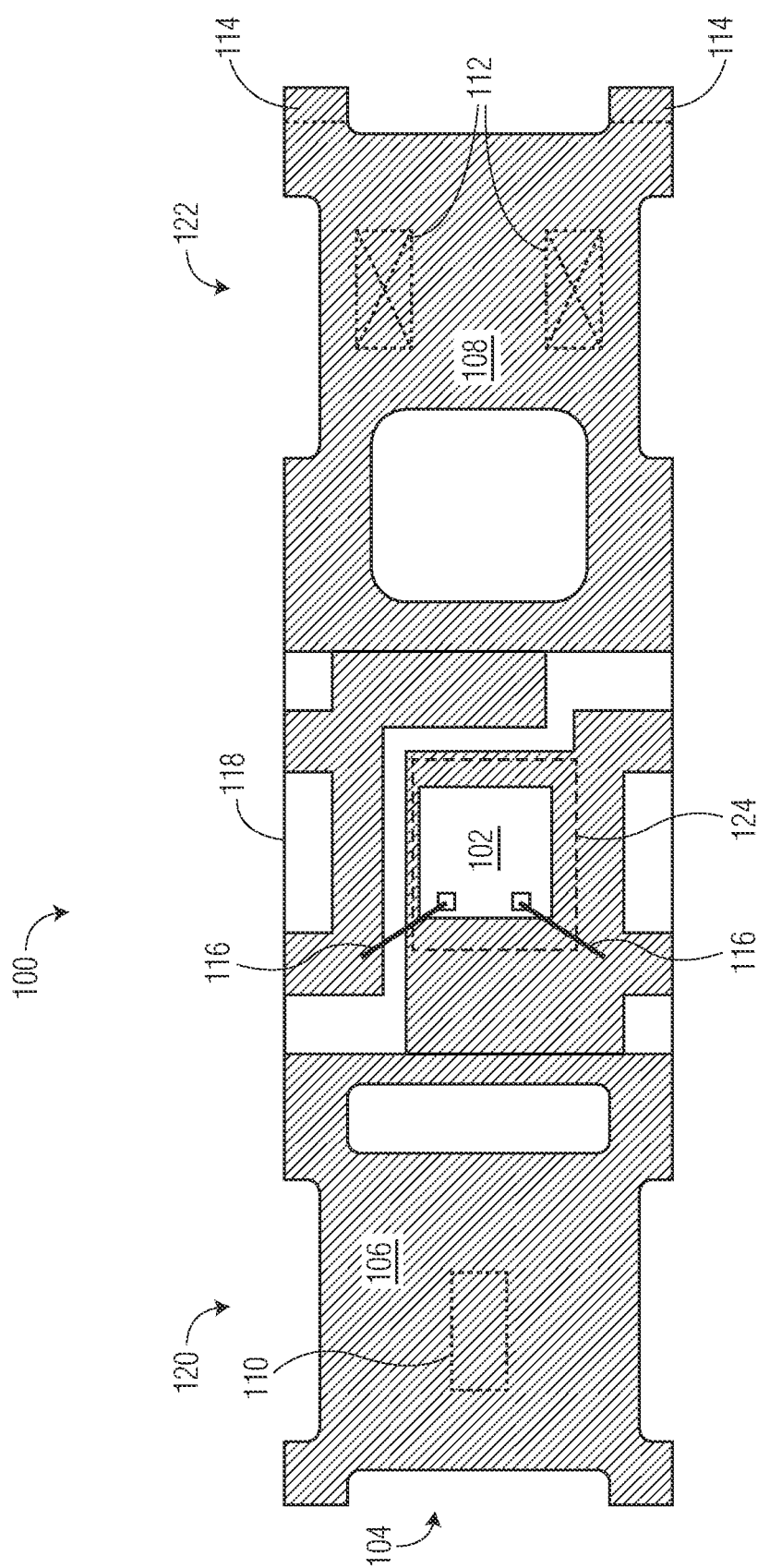
FIG. 1 illustrates, in a simplified plan view, an example semiconductor device having an attached battery at a stage of manufacture in accordance with an embodiment.

FIG. 1 illustrates, in a simplified plan view, an example semiconductor device 100 having an attached battery at a stage of manufacture in accordance with an embodiment. At this stage, the semiconductor device 100 includes a semiconductor die 102 mounted on a package leadframe 104. In this embodiment, the semiconductor die 102 is affixed to a die pad region 124 of the leadframe 104 and encapsulated with an encapsulant 118. Simplified side-on cross-sectional views of the example semiconductor device 100 are shown at stages of manufacture depicted in FIG. 2 through FIG. 6.

The semiconductor die 102 has an active side (e.g., major side having circuitry) and a backside (e.g., major side opposite of the active side). The semiconductor die 102 includes bond pads formed at the active side. The bond pads are configured for connection to the leadframe 104 by way of bond wires 116, for example. In this embodiment, the backside of the semiconductor die 102 is affixed to the die pad region 124 of the leadframe 104. The semiconductor die 102 may be formed from any suitable semiconductor material, such as silicon, germanium, gallium arsenide, gallium nitride, and the like. The semiconductor die 102 may be configured as a single system-on-chip (SoC) semiconductor die including subsystems such as controller, communication, and sensor circuit blocks, for example. In some embodiments, the circuit blocks of the system may be implemented across a plurality of semiconductor die attached at the die pad region 124 of the leadframe 104.

The leadframe 104 includes a first battery lead 106 and a second battery lead 108 separate from the first battery lead 106. In this embodiment, the first battery lead 106 of the leadframe 104 includes the die pad region 124, a first wire bonding region adjacent to the die pad region, and an exposed (e.g., not encapsulated with encapsulant 118) portion 120, and the second battery lead 108 of the leadframe 104 includes a second wire bonding region proximate to the die pad region 124 and an exposed portion 122. In this embodiment, the battery leads 106 and 108 are configured as a battery holder formed at subsequent stages of manufacture. For example, the battery lead 106 is configured to form a base portion of the battery holder and the battery lead 108 is configured to form a clasp portion of the battery holder. The term "clasp", as used herein with regard to the battery holder, generally refers a portion of the battery holder which holds and secures a battery on the base of the holder. For example, the battery is secured between the base and the clasp portions of the battery holder.

The exposed portion 120 of the battery lead 106 is configured for connection of a negative terminal of the battery (attached at a subsequent stage of manufacture) and the exposed portion 122 of the battery lead 108 is configured for connection of a positive terminal of the battery, for example. In this embodiment, a first bond pad of the semiconductor die 102 is connected to the first wire bonding region of the battery lead 106 by way of a first bond wire 116 and a second bond pad of the semiconductor die is connected to the second wire bonding region of the battery lead 108 by way of a second bond wire 116. The bond wires 116 may be formed from a suitable metal material such as copper, silver, gold, or alloys thereof, for example. The number, location, and arrangement of bond wires 116 depicted in FIG. 1 are examples chosen for illustration purposes. The leadframe 104 may further include contacting features 110 and 112 and locking features 114, for example. Portions of the leadframe 104 such as tie bars and dam bars discarded during package singulation not shown for illustration purposes.

FIG. 2 through FIG. 6 illustrate, in simplified side-on cross-sectional views, the example semiconductor device 100 at stages of manufacture in accordance with an embodiment.

Figure 2:
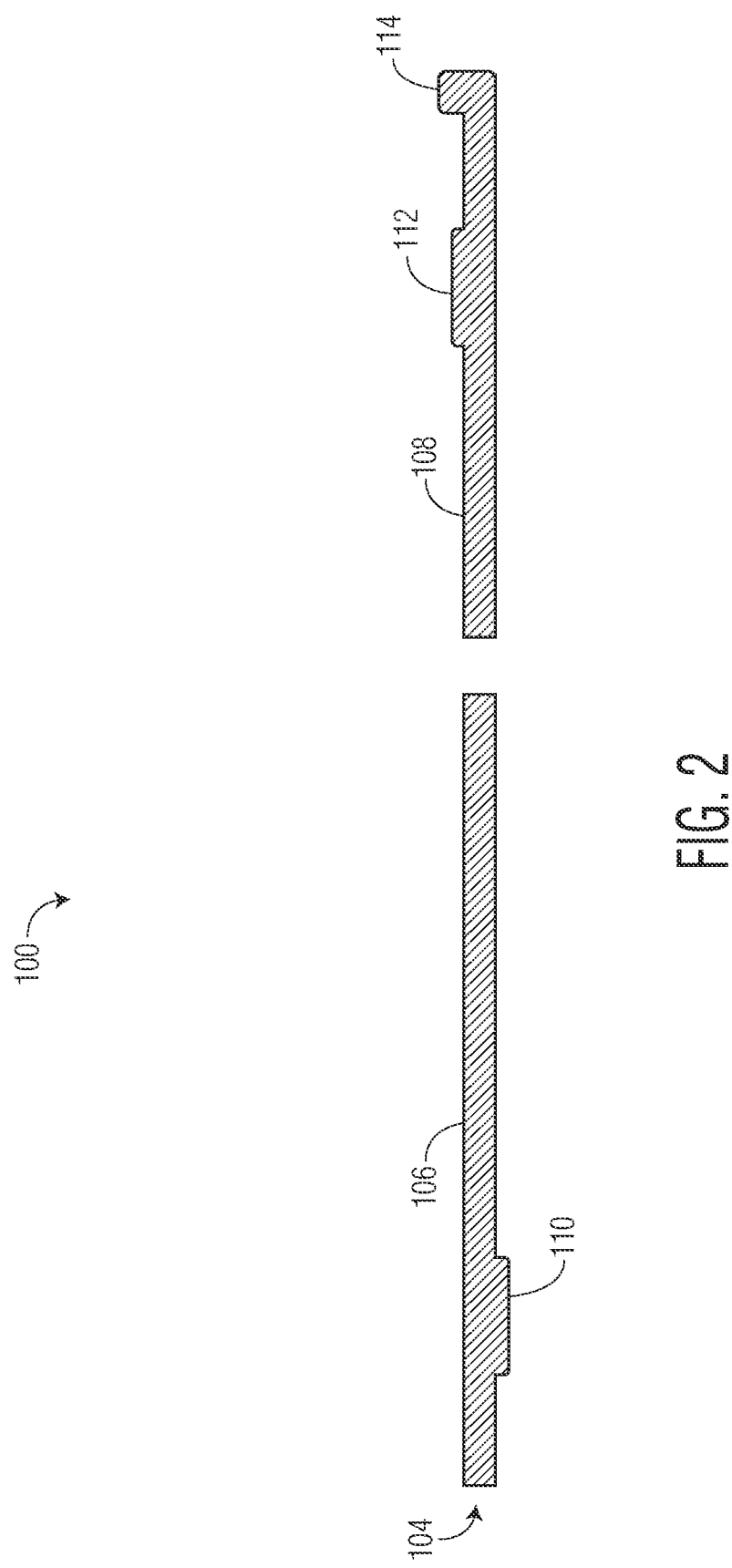
FIG. 2 through FIG. 6 illustrate, in simplified side-on cross-sectional views, the example semiconductor device at stages of manufacture in accordance with an embodiment.

FIG. 2 illustrates, in a simplified side-on cross-sectional view, the example semiconductor device 100 at a stage of manufacture in accordance with an embodiment. At this stage, the semiconductor device 100 includes the package leadframe 104. In this embodiment, the leadframe 104 is configured for attachment of the semiconductor die 102 (at a subsequent stage of manufacture). The contacting features 110 and 112 are shown as protrusions configured to provide enhanced contact with the battery when attached. The locking features 114 are shown as an extended portion of the battery lead 108 configured to hold and secure the battery when attached. The leadframe 104 may be formed from any suitable metal materials, such as copper, nickel, aluminum, iron, or alloys thereof, for example. The leadframe 104 may be bare, partially plated, or plated with another metal or alloy.

Figure 3:
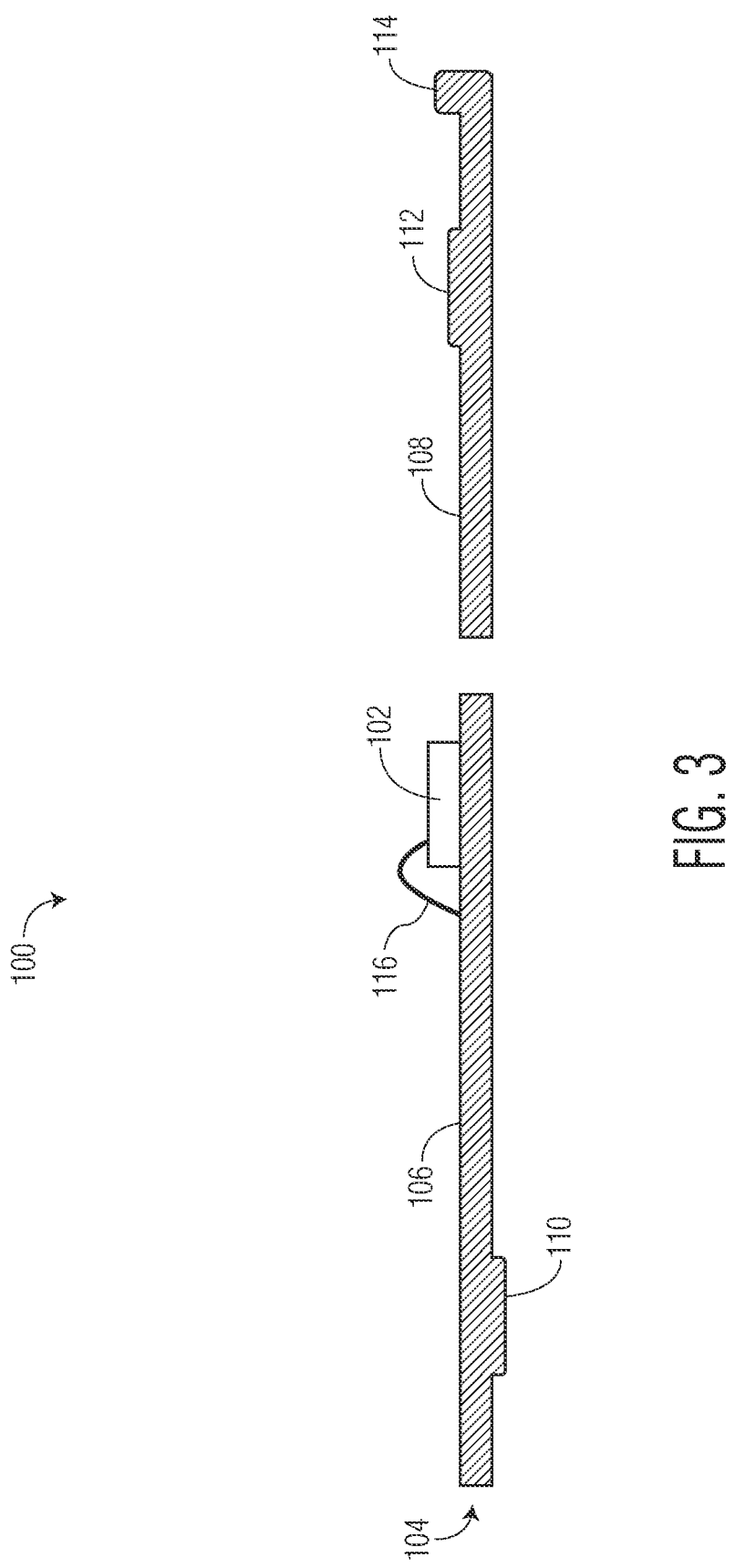

FIG. 3 illustrates, in a simplified side-on cross-sectional view, the example semiconductor device 100 at a subsequent stage of manufacture in accordance with an embodiment. At this stage, the semiconductor device 100 includes the semiconductor die 102 affixed to the package leadframe 104. In this embodiment, a backside of the semiconductor die 102 is attached to the die pad region of leadframe 104 by way of a suitable die attach material (not shown). The die attach material may be characterized as a conductive or non-conductive die attach material. For example, die attach material formed as a silver-filled epoxy, solder paste, or conductive DAF, or may be formed as a non-conductive epoxy or DAF. The term conductive, as used herein, generally refers to the property of electrical conductivity unless otherwise described. After the semiconductor die 102 is attached to the leadframe 104, bond pads of the semiconductor die may be connected to respective battery leads 106 and 108 of the leadframe 104 by way of bond wires 116.

Figure 4:
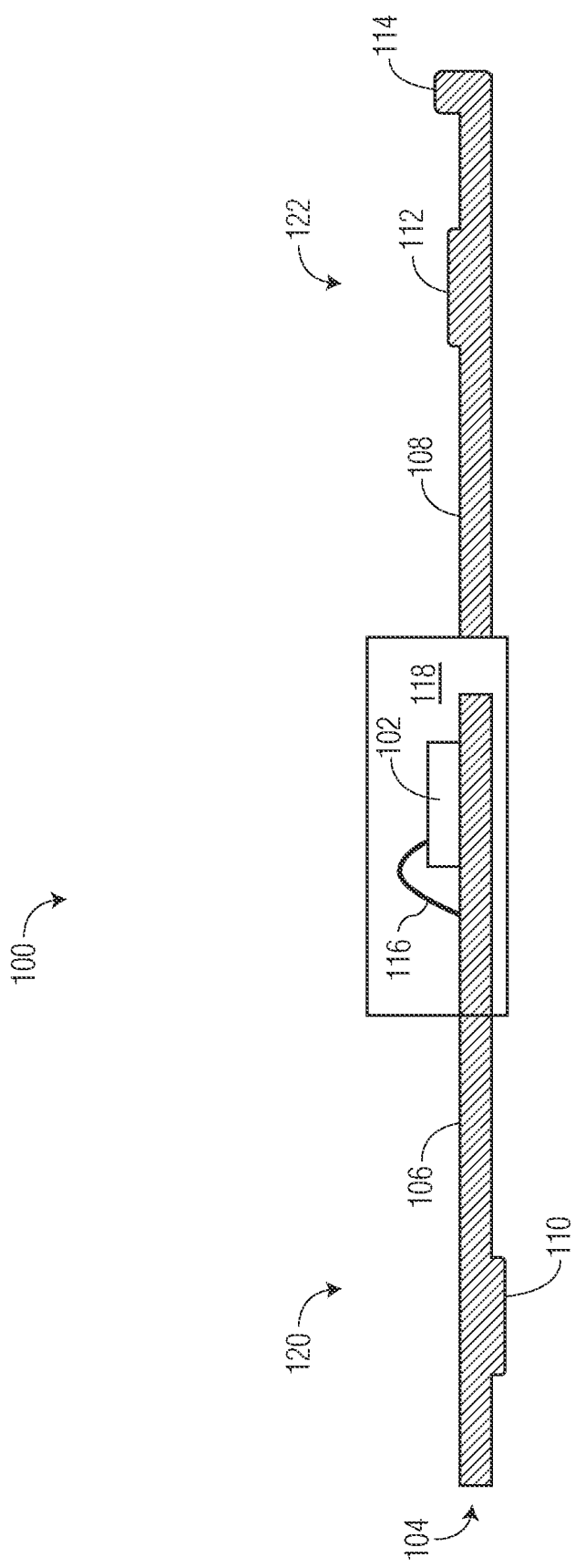

FIG. 4 illustrates, in a simplified side-on cross-sectional view, the example semiconductor device 100 at a subsequent stage of manufacture in accordance with an embodiment. At this stage, the semiconductor device 100 includes the semiconductor die 102 and portions of the battery leads 106 and 108 encapsulated with the encapsulant 118. The encapsulant 118 may be an epoxy molding compound dispensed during an injection molding encapsulation operation, for example. After the molding operation, the semiconductor device 100 may be singulated (e.g., trimmed) from a leadframe strip. Exposed portions 120 and 122 remain free of molding compound after the molding operation.

Figure 5:
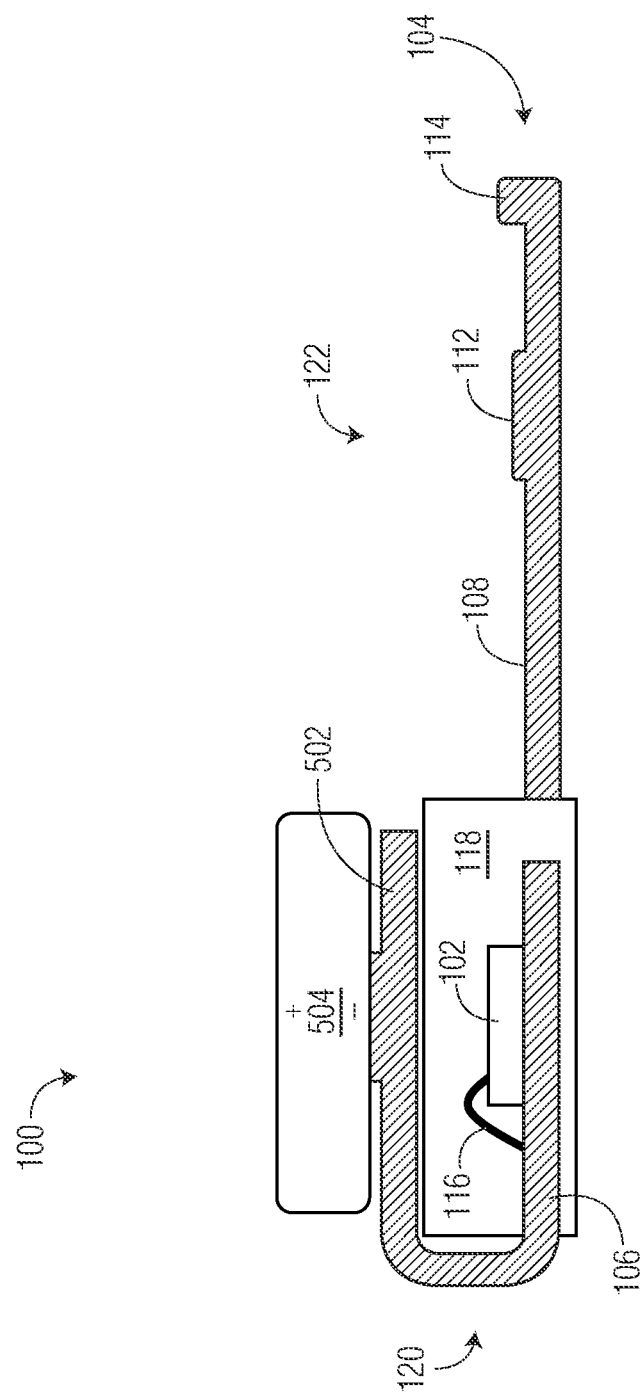

FIG. 5 illustrates, in a simplified side-on cross-sectional view, the example semiconductor device 100 at a subsequent stage of manufacture in accordance with an embodiment. At this stage, the semiconductor device 100 includes a base 502 of the battery holder formed from the exposed portion 120 of the leadframe 104. In this embodiment, the exposed portion 120 of the battery lead 106 is folded (e.g., bent) up along a first sidewall portion and over a top surface portion of the encapsulated semiconductor die 102. The exposed portion 120 is bent around the outer portion of the encapsulant 118 such that a substantially planar portion of the exposed portion 120 is located over the top surface of the encapsulant 118. The planar portion of the battery lead 106 over the top surface of the encapsulant 118 is configured as the base 502 of the battery holder.

After forming the base 502 of the battery holder, a battery 504 is conductively attached. A bottom side of the battery 504 may be attached to the base of the battery holder by way of a conductive adhesive, conductive epoxy, solder paste, or the like (not shown). In this embodiment, the battery 504 is characterized as a button or coin style battery type having a first major side (e.g., bottom side) as a negative terminal (−) of the battery and a second major side (e.g., opposite of the first major side) as a positive terminal (+) of the battery. The battery 504 may be formed as a single cell or plurality of cells configured to provide a predetermined nominal voltage and current capacity (e.g., 1.5 volts and 100 microampere-hours). The battery 504 may be formed from suitable materials and chemistries. In this embodiment, the battery lead 106 is connected to the negative (−) terminal of the battery 504 by way of the battery holder base 502.

Figure 6:
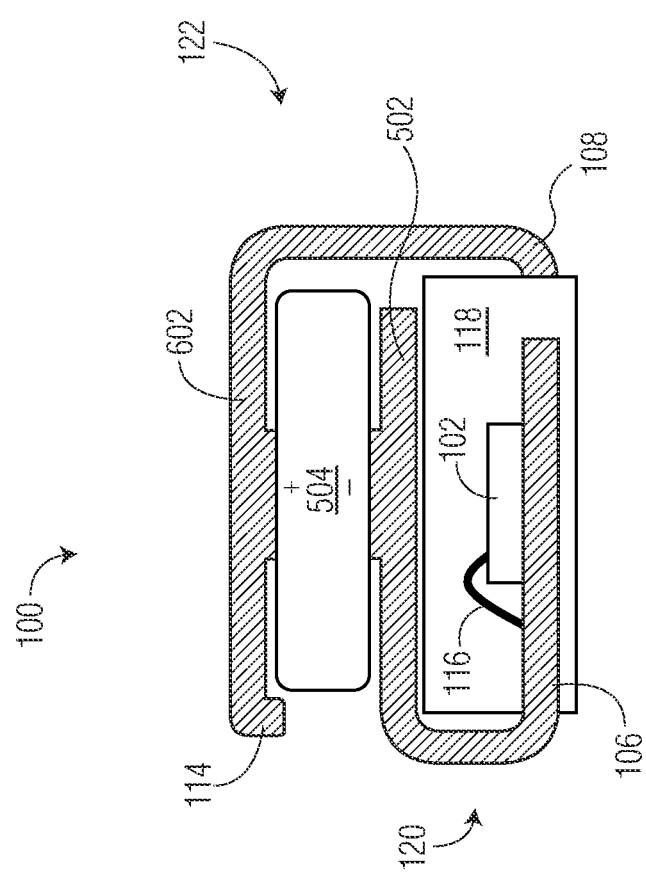

FIG. 6 illustrates, in a simplified side-on cross-sectional view, the example semiconductor device 100 at a subsequent stage of manufacture in accordance with an embodiment. At this stage, the semiconductor device 100 includes a clasp 602 of the battery holder formed from the exposed portion 122 of the leadframe 104. In this embodiment, the exposed portion 122 of the battery lead 108 is folded (e.g., bent) up along a second sidewall portion (e.g., opposite of the first sidewall portion) and over a top surface portion of the battery 504. The exposed portion 122 is bent around the outer portion of the encapsulant 118 and battery 504 such that a substantially planar portion of the exposed portion 122 is located over the top surface of the battery. The planar portion over the top surface of the battery 504 along with the locking features 114 is configured as the clasp 602 of the battery holder securing the battery in place. The top side of the battery 504 may be attached to the clasp 602 of the battery holder by way of a conductive adhesive (not shown) if desired. In this embodiment, the battery lead 108 is connected to the positive (+) terminal of the battery 504 by way of the battery holder clasp 602. With the battery leads 106 and 108 connected to the respective negative (−) and positive (+) terminals of the battery 504 by way of the battery holder, various battery sizes, shapes, and configurations may be accommodated by the semiconductor device 100. In this embodiment, the battery 504 is configured to supply an operating voltage and current to the semiconductor die 102 sufficient for the semiconductor device 100 to operate in a self-sustained manner over a predetermined period of time.

Figure 7:
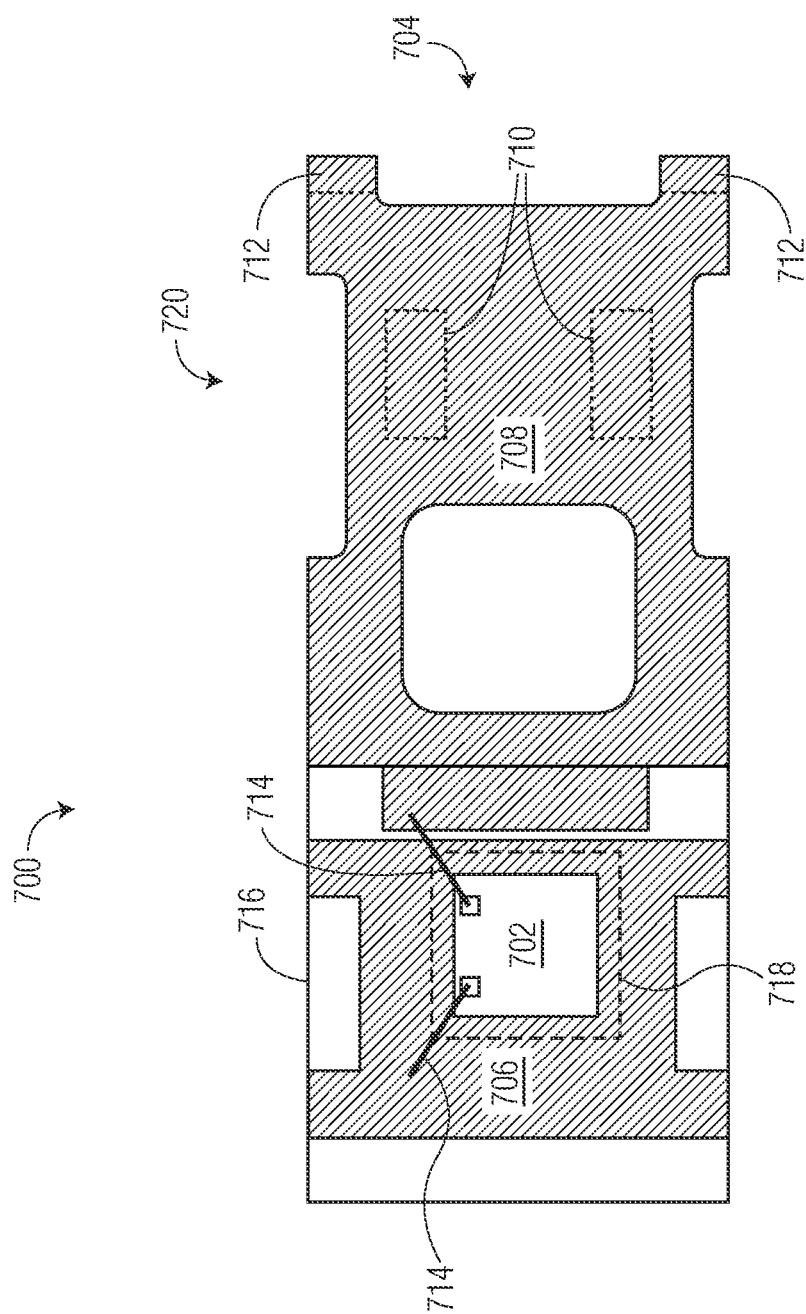
FIG. 7 illustrates, in a simplified plan view, an alternative example semiconductor device having an attached battery at a stage of manufacture in accordance with an embodiment.

FIG. 7 illustrates, in a simplified plan view, an alternative example semiconductor device 700 having an attached battery at a stage of manufacture in accordance with an embodiment. At this stage, the semiconductor device 700 includes a semiconductor die 702 mounted on a package leadframe 704. In this embodiment, the semiconductor die 702 is affixed to a die pad region 718 of the leadframe 704 and encapsulated with an encapsulant 716. Simplified side-on cross-sectional views of the example semiconductor device 700 are shown at stages of manufacture depicted in FIG. 8 through FIG. 11.

The semiconductor die 702 has an active side (e.g., major side having circuitry) and a backside (e.g., major side opposite of the active side). The semiconductor die 702 includes bond pads formed at the active side. The bond pads are configured for connection to the leadframe 704 by way of bond wires 714, for example. In this embodiment, the backside of the semiconductor die 702 is affixed to the die pad region 706 of the leadframe 704. The semiconductor die 702 may be formed from any suitable semiconductor material, such as silicon, germanium, gallium arsenide, gallium nitride, and the like. The semiconductor die 702 may be configured as a single system-on-chip (SoC) semiconductor die including subsystems such as controller, communication, and sensor circuit blocks, for example. In some embodiments, the circuit blocks of the system may be implemented across a plurality of semiconductor die attached at the die pad region 718 of the leadframe 704.

The leadframe 704 includes a first battery lead 706 and a second battery lead 708 separate from the first battery lead 706. In this embodiment, the first battery lead 706 of the leadframe 704 includes the die pad region 718, a first wire bonding region adjacent to the die pad region, and an exposed backside portion (not shown), and the second battery lead 708 of the leadframe 704 includes a second wire bonding region proximate to the die pad region 718 and an exposed portion 720. In this embodiment, the battery leads 706 and 708 are configured as a battery holder formed at subsequent stages of manufacture. For example, the battery lead 706 is configured to form a base portion of the battery holder and the battery lead 708 is configured to form a clasp portion of the battery holder.

The exposed backside portion of the battery lead 706 is configured for connection of a negative terminal of the battery (attached at a subsequent stage of manufacture) and the exposed portion 720 of the battery lead 708 is configured for connection of a positive terminal of the battery, for example. In this embodiment, a first bond pad of the semiconductor die 702 is connected to the first wire bonding region of the battery lead 706 by way of a first bond wire 714 and a second bond pad of the semiconductor die is connected to the second wire bonding region of the battery lead 708 by way of a second bond wire 714. The bond wires 714 may be formed from a suitable metal material such as copper, silver, gold, or alloys thereof, for example. The number, location, and arrangement of bond wires 714 depicted in FIG. 7 are examples chosen for illustration purposes. The leadframe 704 may further include contacting features 710 and locking features 712, for example. Portions of the leadframe 704 such as tie bars and dam bars discarded during package singulation not shown for illustration purposes.

FIG. 8 through FIG. 11 illustrate, in simplified side-on cross-sectional views, the alternative example semiconductor device 700 at stages of manufacture in accordance with an embodiment.

Figure 8:
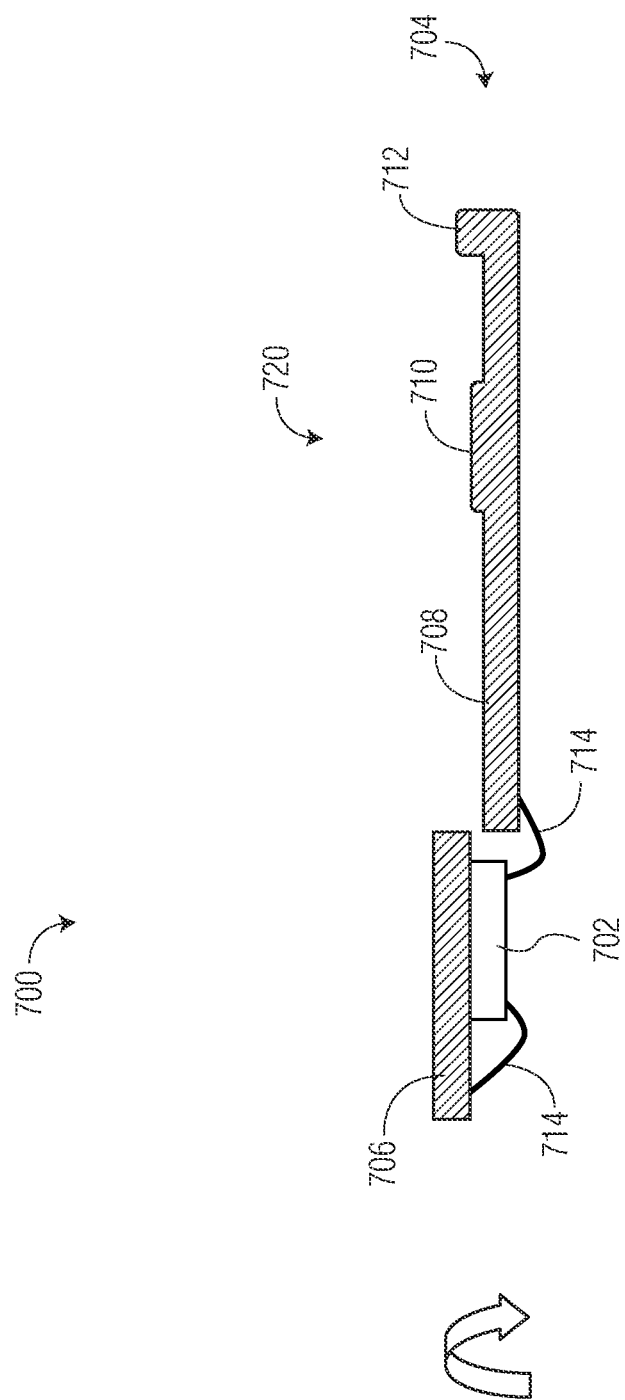
FIG. 8 through FIG. 11 illustrate, in simplified side-on cross-sectional views, the alternative example semiconductor device at stages of manufacture in accordance with an embodiment.

FIG. 8 illustrates, in a simplified side-on cross-sectional view, the example semiconductor device 700 at a stage of manufacture in accordance with an embodiment. At this stage, the semiconductor device 700 includes the semiconductor die 702 affixed to the package leadframe 704 and rotated (e.g., flipped) such that the semiconductor die 702 is in an active-side-down orientation. The contacting features 710 are shown as protrusions configured to provide enhanced contact with the battery when attached. The locking features 712 are shown as an extended portion of the battery lead 708 configured to hold and secure the battery when attached. The leadframe 704 may be formed from any suitable metal materials, such as copper, nickel, aluminum, iron, or alloys thereof, for example. The leadframe 704 may be bare, partially plated, or plated with another metal or alloy.

In this embodiment, a backside of the semiconductor die 702 is attached to the die pad region of leadframe 704 by way of a suitable die attach material (not shown). The die attach material may be characterized as a conductive or non-conductive die attach material. After the semiconductor die 702 is attached to the leadframe 704, bond pads of the semiconductor die may be connected to respective battery leads 706 and 708 of the leadframe 704 by way of bond wires 714.

Figure 9:
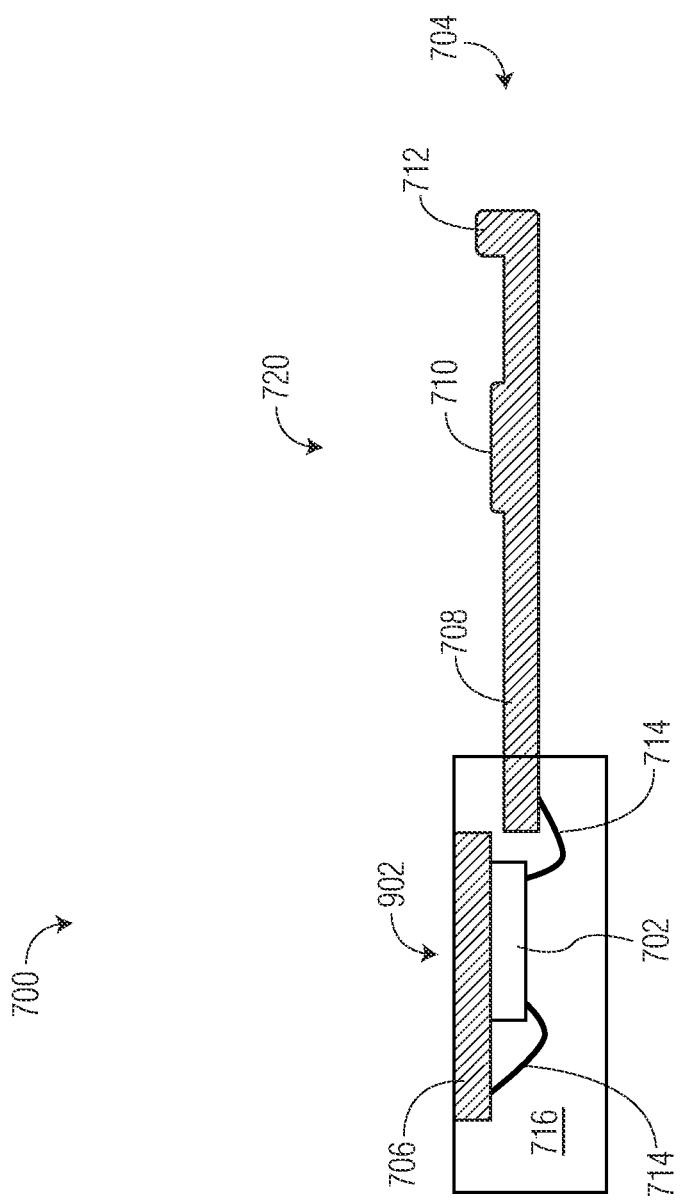
Figure 10:
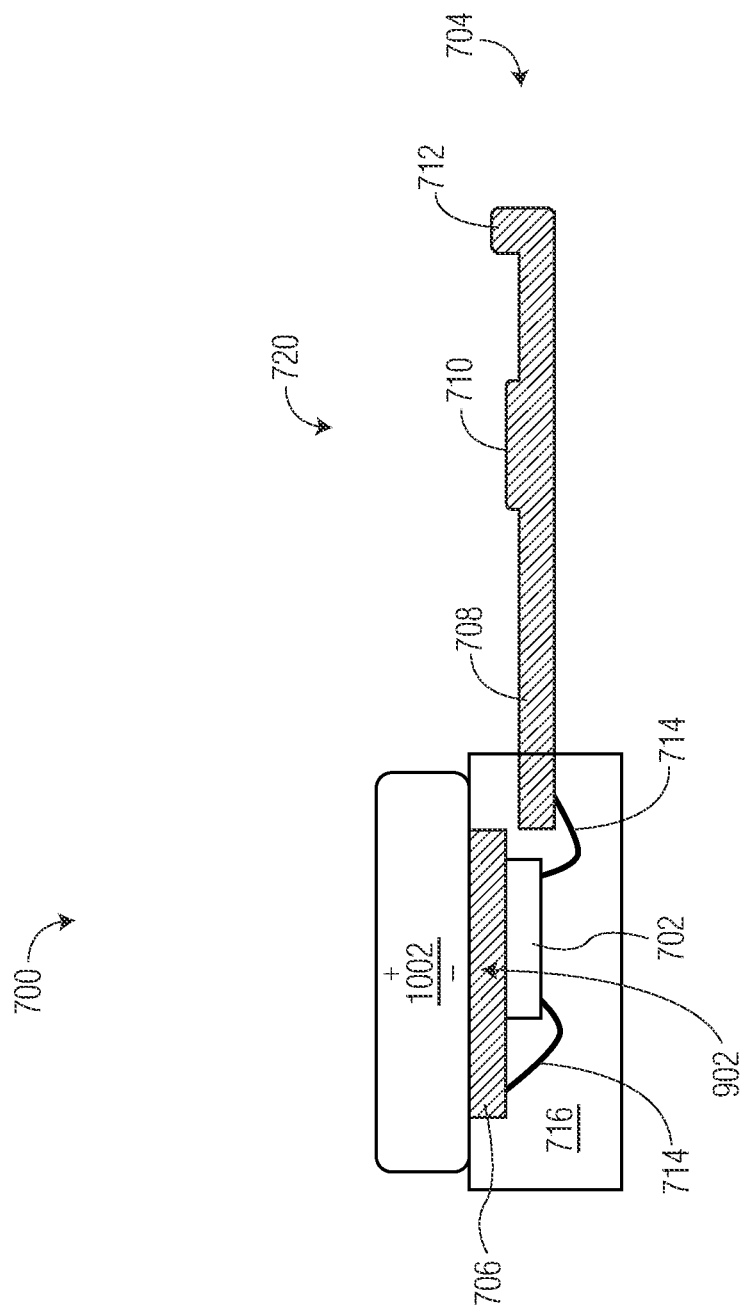

FIG. 9 illustrates, in a simplified side-on cross-sectional view, the example semiconductor device 700 at a subsequent stage of manufacture in accordance with an embodiment. At this stage, the semiconductor device 700 includes the semiconductor die 702 and portions of the battery leads 706 and 708 encapsulated with the encapsulant 716. The encapsulant 716 may be an epoxy molding compound dispensed during an injection molding encapsulation operation, for example. After the molding operation, the semiconductor device 700 may be singulated (e.g., trimmed) from a leadframe strip. In this embodiment, the backside of the battery lead 706 (including die pad region 718) is exposed through the encapsulant 716. The exposed backside portion 902 of the battery lead 706 and the exposed portion 720 of the battery lead 708 remain free of molding compound after the molding operation. In this embodiment, the exposed backside portion 902 of the battery lead 706 is located over the semiconductor die 702 and configured as the base 902 of the battery holder FIG. 10 illustrates, in a simplified side-on cross-sectional view, the example semiconductor device 700 at a subsequent stage of manufacture in accordance with an embodiment. At this stage, the semiconductor device 700 includes a battery 1002 conductively attached to the base 902 of the battery holder. The bottom side of the battery 1002 may be attached to the base 902 of the battery holder by way of a conductive adhesive, conductive epoxy, solder paste, or the like (not shown). In this embodiment, the battery 1002 is characterized as a button or coin style battery type having a first major side (e.g., bottom side) as a negative terminal (−) of the battery and a second major side (e.g., opposite of the first major side) as a positive terminal (+) of the battery. In this embodiment, the battery lead 706 is connected to the negative (−) terminal of the battery 1002 by way of the battery holder base 902.

Figure 11:
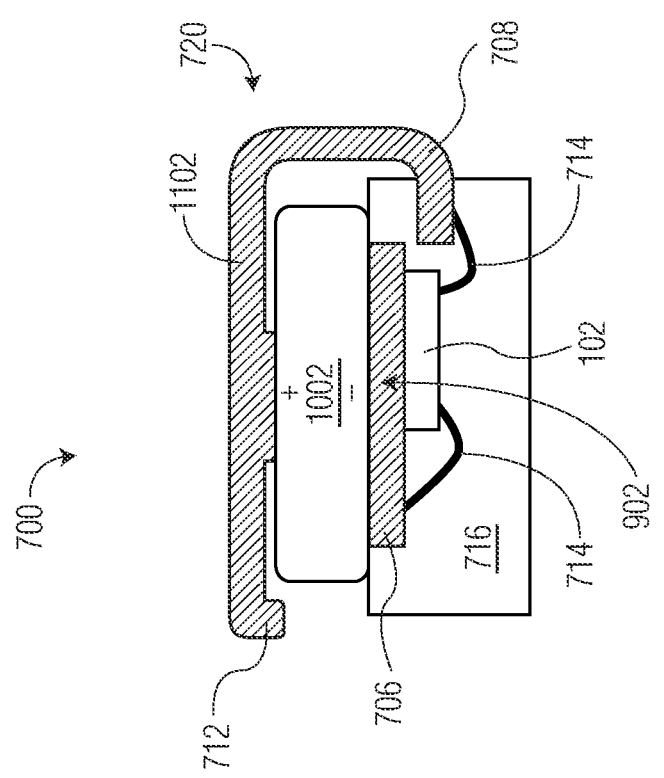

FIG. 11 illustrates, in a simplified side-on cross-sectional view, the example semiconductor device 700 at a subsequent stage of manufacture in accordance with an embodiment. At this stage, the semiconductor device 700 includes a clasp 1102 of the battery holder formed from the exposed portion 720 of the leadframe 704. In this embodiment, the exposed portion 720 of the battery lead 708 is folded (e.g., bent) up along a sidewall portion and over a top surface portion of the battery 1002. The exposed portion 720 is bent around the outer portion of the encapsulant 716 and battery 1002 such that a substantially planar portion of the exposed portion 720 is located over the top surface of the battery. The planar portion over the top surface of the battery 1002 along with the locking features 712 is configured as the clasp 1102 of the battery holder securing the battery in place. The top side of the battery 1002 may be attached to the clasp 1102 of the battery holder by way of a conductive adhesive (not shown) if desired. In this embodiment, the battery lead 708 is connected to the positive (+) terminal of the battery 1002 by way of the battery holder clasp 1102. With the battery leads 706 and 708 connected to the respective negative (−) and positive (+) terminals of the battery 1002 by way of the battery holder, various battery sizes, shapes, and configurations may be accommodated by the semiconductor device 700. In this embodiment, the battery 1002 is configured to supply an operating voltage and current to the semiconductor die 702 sufficient for the semiconductor device 700 to operate in a self-sustained manner over a predetermined period of time.

Generally, there is provided, a method of manufacturing a semiconductor device including affixing a semiconductor die to a die pad region of a first battery lead of a leadframe, the first battery lead of the leadframe separated from a second battery lead of the leadframe; encapsulating with an encapsulant the semiconductor die and portions of the first and second battery leads of the leadframe; affixing a battery to an exposed portion of the first battery lead of the leadframe, a first terminal of the battery conductively connected to the first battery lead; and bending an exposed portion of the second battery lead of the leadframe to overlap a top surface portion of the battery, a second terminal of the battery conductively connected to the second battery lead. The affixed battery may be located directly over the encapsulated semiconductor die. The bent exposed portion of the second battery lead of the leadframe may be configured to secure the battery over the encapsulated semiconductor die. The exposed portion of the first battery lead of the leadframe may be exposed through a backside surface of the encapsulated semiconductor die. The method may further include connecting a first bond pad of the semiconductor die to the first battery lead of the leadframe by way of a first bond wire and connecting a second bond pad of the semiconductor die to the second battery lead of the leadframe by way of a second bond wire. The battery may be configured to supply an operating voltage and current to the encapsulated semiconductor die. The method may further include bending the exposed portion of the first battery lead of the leadframe to overlap a top surface portion of the encapsulated semiconductor die before affixing the battery. The battery may be secured between a portion of the first battery lead of the leadframe overlapping the top surface portion of the encapsulated semiconductor die and a portion of the second battery lead of the leadframe overlapping the top surface of the battery. The first battery lead of the leadframe may be configured for connection to a negative terminal of the battery and the second battery lead of the leadframe is configured for connection to a positive terminal of the battery.

In another embodiment, there is provided, a semiconductor device including a leadframe including a first battery lead and a second battery lead, the first battery lead separate from the second battery lead; a semiconductor die affixed to a die pad region of the first battery lead of the leadframe; an encapsulant encapsulating the semiconductor die and portions of the first and second battery leads of the leadframe; a battery affixed to an exposed portion of the first battery lead of the leadframe, a bottom surface portion of the battery conductively connected to the first battery lead; and an exposed portion of the second battery lead of the leadframe bent such that a portion of the exposed portion of the second battery lead overlaps the battery, a top surface portion of the battery conductively connected to the portion of the exposed second battery lead. The affixed battery may be located directly over the encapsulated semiconductor die. The portion of the exposed portion of the second battery lead of the leadframe may be configured to secure the battery over the encapsulated semiconductor die. The exposed portion of the first battery lead of the leadframe may be exposed through a backside surface of the encapsulated semiconductor die. The first battery lead of the leadframe may be configured for connection to a negative terminal of the battery and the second battery lead of the leadframe is configured for connection to a positive terminal of the battery. The battery may be configured to supply an operating voltage and current to the encapsulated semiconductor die.

In yet another embodiment, there is provided, a method of manufacturing a semiconductor device including affixing a semiconductor die to a die pad region of a first battery lead of a leadframe, the first battery lead of the leadframe separated from a second battery lead of the leadframe; encapsulating with an encapsulant the semiconductor die and portions of the first and second battery leads of the leadframe; affixing a battery to an exposed portion of the first battery lead of the leadframe, the affixed battery located directly over the encapsulated semiconductor die; and bending an exposed portion of the second battery lead of the leadframe to overlap a top surface portion of the battery, a portion of the exposed portion of the second battery lead configured to secure the battery over the encapsulated semiconductor die. The exposed portion of the first battery lead of the leadframe may be exposed through a backside surface of the encapsulated semiconductor die. The affixing the battery to the exposed portion of the first battery lead of the leadframe may include forming a conductive connection between the exposed portion of the first battery lead of the leadframe and a negative terminal of the battery. The method may further include connecting a first bond pad of the semiconductor die to the first battery lead of the leadframe by way of a first bond wire and connecting a second bond pad of the semiconductor die to the second battery lead of the leadframe by way of a second bond wire before encapsulating with the encapsulant. The method may further include bending the exposed portion of the first battery lead of the leadframe to overlap a top surface portion of the encapsulated semiconductor die before affixing the battery.

By now it should be appreciated that there has been provided, a semiconductor device having an attached battery. The semiconductor device includes a package leadframe configured to form an integrated battery holder. The leadframe includes a first section and a second section. The first section is configured as a first battery lead and the second section is configured as a second battery lead of the leadframe. An encapsulant encapsulates portions of the first and second battery leads. An exposed portion first battery lead is formed a base portion of the battery holder and an exposed portion of the second battery lead is formed as clasp or securing portion of the battery holder. A battery is affixed to the base portion of the battery holder and the clasp or securing portion holds and secures the battery in place. The battery leads are connected to the respective terminals of the battery by way of the battery holder allowing for the semiconductor device to accommodate various battery sizes, shapes, and configurations. The battery is configured to supply an operating voltage and current to the semiconductor device sufficient to operate in a self-sustained manner.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The invention claimed is:

1. A method of manufacturing a semiconductor device, the method comprising:
    affixing a semiconductor die to a die pad region of a first battery lead of a leadframe, the first battery lead of the leadframe separated from a second battery lead of the leadframe;
    encapsulating with an encapsulant the semiconductor die and portions of the first and second battery leads of the leadframe;
    affixing a battery to an exposed portion of the first battery lead of the leadframe, a first terminal of the battery conductively connected to the first battery lead; and
    bending an exposed portion of the second battery lead of the leadframe to overlap a top surface portion of the battery, a second terminal of the battery conductively connected to the second battery lead.

2. The method of claim 1, wherein the affixed battery is located directly over the encapsulated semiconductor die.

3. The method of claim 1, wherein the bent exposed portion of the second battery lead of the leadframe is configured to secure the battery over the encapsulated semiconductor die.

4. The method of claim 1, wherein the exposed portion of the first battery lead of the leadframe is exposed through a backside surface of the encapsulated semiconductor die.

5. The method of claim 1, further comprising connecting a first bond pad of the semiconductor die to the first battery lead of the leadframe by way of a first bond wire and connecting a second bond pad of the semiconductor die to the second battery lead of the leadframe by way of a second bond wire.

6. The method of claim 1, wherein the battery is configured to supply an operating voltage and current to the encapsulated semiconductor die.

7. The method of claim 1, further comprising bending the exposed portion of the first battery lead of the leadframe to overlap a top surface portion of the encapsulated semiconductor die before affixing the battery.

8. The method of claim 7, wherein the battery is secured between a portion of the first battery lead of the leadframe overlapping the top surface portion of the encapsulated semiconductor die and a portion of the second battery lead of the leadframe overlapping the top surface of the battery.

9. The method of claim 1, wherein the first battery lead of the leadframe is configured for connection to a negative terminal of the battery and the second battery lead of the leadframe is configured for connection to a positive terminal of the battery.

10. A method of manufacturing a semiconductor device, the method comprising:
    affixing a semiconductor die to a die pad region of a first battery lead of a leadframe, the first battery lead of the leadframe separated from a second battery lead of the leadframe;
    encapsulating with an encapsulant the semiconductor die and portions of the first and second battery leads of the leadframe;
    affixing a battery to an exposed portion of the first battery lead of the leadframe, the affixed battery located directly over the encapsulated semiconductor die; and
    bending an exposed portion of the second battery lead of the leadframe to overlap a top surface portion of the battery, a portion of the exposed portion of the second battery lead configured to secure the battery over the encapsulated semiconductor die.

11. The method of claim 10, wherein the exposed portion of the first battery lead of the leadframe is exposed through a backside surface of the encapsulated semiconductor die.

12. The method of claim 10, wherein affixing the battery to the exposed portion of the first battery lead of the leadframe includes forming a conductive connection between the exposed portion of the first battery lead of the leadframe and a negative terminal of the battery.

13. The method of claim 10, further comprising connecting a first bond pad of the semiconductor die to the first battery lead of the leadframe by way of a first bond wire and connecting a second bond pad of the semiconductor die to the second battery lead of the leadframe by way of a second bond wire before encapsulating with the encapsulant.

14. The method of claim 10, further comprising bending the exposed portion of the first battery lead of the leadframe to overlap a top surface portion of the encapsulated semiconductor die before affixing the battery.

* * * * *